US007303827B2

(12) United States Patent
Kinlen et al.

(10) Patent No.: US 7,303,827 B2
(45) Date of Patent: Dec. 4, 2007

(54) LIGHT-EMITTING PHOSPHOR PARTICLES AND ELECTROLUMINESCENT DEVICES EMPLOYING SAME

(75) Inventors: Patrick J. Kinlen, Fenton, MO (US); Matthew Murrasko, Manhattan Beach, CA (US)

(73) Assignee: Lumimove, Inc., St. Louis, MO (US)

( * ) Notice: Subject to any disclaimer, the term of this patent is extended or adjusted under 35 U.S.C. 154(b) by 0 days.

(21) Appl. No.: 11/344,934

(22) Filed: Feb. 1, 2006

(65) Prior Publication Data

US 2006/0127670 A1 Jun. 15, 2006

Related U.S. Application Data

(62) Division of application No. 10/207,576, filed on Jul. 29, 2002, now Pat. No. 7,029,763.

(51) Int. Cl.

| | |
|---|---|
| ***H01L 51/54*** | (2006.01) |
| ***H05B 33/14*** | (2006.01) |
| ***B32B 1/10*** | (2006.01) |
| ***C09K 11/06*** | (2006.01) |
| ***C09K 11/02*** | (2006.01) |

(52) U.S. Cl. ...................... 428/690; 428/323; 428/403; 428/917; 252/301.16; 252/301.35; 106/31.13

(58) Field of Classification Search ................ 428/690, 428/917, 403, 323; 252/301.65, 301.16, 252/301.35; 313/503, 504, 506, 509; 106/31.13
See application file for complete search history.

(56) References Cited

U.S. PATENT DOCUMENTS

| | | | | |
|---|---|---|---|---|
| 2,924,732 | A | 2/1960 | Lehmann | 313/108 |
| 3,052,810 | A | 9/1962 | Mash | 313/108 |
| 3,621,321 | A | 11/1971 | Williams et al. | 313/108 A |
| 4,263,339 | A | 4/1981 | Fischer | 427/64 |
| 4,539,507 | A | 9/1985 | VanSlyke et al. | 313/504 |
| 4,672,265 | A | 6/1987 | Eguchi et al. | 313/504 |
| 4,855,189 | A | 8/1989 | Simopoulos et al. | 428/690 |
| 4,855,190 | A | 8/1989 | Bezner | 428/690 |
| 4,857,416 | A | 8/1989 | Kreiling et al. | 428/690 |
| 5,247,190 | A | 9/1993 | Friend et al. | 257/40 |
| 5,309,070 | A | 5/1994 | Sun et al. | 313/503 |
| 5,309,071 | A | 5/1994 | Karam et al. | 313/509 |
| 5,426,792 | A | 6/1995 | Murasko | 2/422 |
| 5,457,565 | A | 10/1995 | Namiki et al. | 359/273 |

(Continued)

FOREIGN PATENT DOCUMENTS

| | | | |
|---|---|---|---|
| EP | 0294061 | A1 | 7/1988 |
| WO | WO 98/53645 | | 11/1998 |

OTHER PUBLICATIONS

United States Patent Application Publication, Pub. No. US 2001/0035716 A1, Nov. 1, 2001.

(Continued)

*Primary Examiner*—Milton I. Cano
*Assistant Examiner*—Camie S. Thompson
(74) *Attorney, Agent, or Firm*—Nelson Mullins Riley & Scarborough, LLP

(57) ABSTRACT

Phosphor particles having coatings comprising certain light emitting small molecules and light-emitting devices employing these phosphor particles and light-emitting small molecules are provided. Also provided are light-emitting devices employing a layer of phosphor material that is covered by at least one layer that contains light-emitting small molecules, and methods of making same.

18 Claims, 8 Drawing Sheets

U.S. PATENT DOCUMENTS

| | | | | |
|---|---|---|---|---|
| 5,543,237 | A | 8/1996 | Watanabe | 428/691 |
| 5,552,679 | A | 9/1996 | Murasko | 315/169.3 |
| 5,554,449 | A | 9/1996 | Tonomura et al. | 428/690 |
| 5,583,394 | A | 12/1996 | Burbank et al. | 313/498 |
| 5,593,782 | A | 1/1997 | Budd | 428/403 |
| 5,598,058 | A | 1/1997 | LaPointe | 313/503 |
| 5,598,059 | A | 1/1997 | Sun et al. | 313/509 |
| 5,602,445 | A | 2/1997 | Solanki et al. | 313/503 |
| 5,612,591 | A | 3/1997 | Katayama et al. | 313/503 |
| 5,635,110 | A | 6/1997 | Chadha et al. | 252/301.4 R |
| 5,643,496 | A | 7/1997 | Brese et al. | 252/301.65 |
| 5,652,067 | A | 7/1997 | Ito et al. | 428/690 |
| 5,667,724 | A | 9/1997 | Petersen | 252/301.6 |
| 5,675,217 | A | 10/1997 | Kang | 313/509 |
| 5,677,594 | A | 10/1997 | Sun et al. | 313/503 |
| 5,682,043 | A | 10/1997 | Pei et al. | 257/40 |
| 5,700,591 | A | 12/1997 | Okajima et al. | 428/690 |
| 5,700,592 | A | 12/1997 | Mueller et al. | 428/690 |
| 5,702,643 | A | 12/1997 | Reddy et al. | 252/301.65 |
| 5,711,898 | A | 1/1998 | Reddy et al. | 252/301.65 |
| 5,912,533 | A | 6/1999 | Lee et al. | 313/503 |
| 5,976,613 | A | 11/1999 | Janusauskas | 427/66 |
| 6,023,371 | A | 2/2000 | Onitsuka et al. | 359/620 |
| 6,053,795 | A | 4/2000 | Whitney et al. | 446/219 |
| 6,198,220 | B1 | 3/2001 | Jones et al. | 313/512 |
| 6,203,391 | B1 | 3/2001 | Murasko | 445/24 |
| 6,218,774 | B1 | 4/2001 | Pope | 313/461 |
| 6,258,954 | B1 | 7/2001 | Kunimoto et al. | 546/36 |
| 6,392,786 | B1 | 5/2002 | Albert | 359/296 |
| 6,406,803 | B1 | 6/2002 | Abe et al. | 428/690 |
| 6,424,088 | B1 | 7/2002 | Murasko | 313/506 |
| 6,489,045 | B1 | 12/2002 | Araki et al. | 428/690 |
| 6,498,049 | B1 | 12/2002 | Friend et al. | 438/34 |
| 6,559,449 | B2 | 5/2003 | Ikeda et al. | 250/361 R |
| 6,562,460 | B1 | 5/2003 | Bayless | 428/402.24 |
| 6,610,223 | B2 | 8/2003 | Lee | 264/9 |
| 6,611,109 | B2 | 8/2003 | Zovko et al. | 315/169.3 |
| 6,613,455 | B1 | 9/2003 | Matsumoto et al. | 428/690 |
| 6,706,551 | B2 | 3/2004 | Andriessen | 438/99 |
| 6,777,724 | B2 | 8/2004 | Duggal et al. | 257/184 |
| 6,811,895 | B2 | 11/2004 | Murasko et al. | 428/690 |
| 6,872,471 | B2 | 3/2005 | Epstein et al. | 428/690 |
| 6,903,505 | B2 | 6/2005 | McNulty et al. | 313/504 |
| 6,965,196 | B2 | 11/2005 | Murasko et al. | 313/506 |

OTHER PUBLICATIONS

United States Patent Application Publication, Pub. No. US 2001/0042329 A1, Nov. 22, 2001.

United States Patent Application Publication, Pub. No. US 2002/0157173 A1, Oct. 31, 2002.

United States Patent Application Publication, Pub. No. US 2002/0159245 A1, Oct. 31, 2002.

United States Patent Application Publication, Pub. No. US 2002/0159246 A1, Oct. 31, 2002.

United States Patent Application Publication, Pub. No. US 2003/0099884 A1, May 29, 2003.

United States Patent Application Publication, Pub. No. US 2003/0140768 A1, Jul. 31, 2003.

United States Patent Application Publication, Pub. No. US 2003/0015962 A1, Jan. 23, 2003.

United States Patent Application Publication, Pub. No. US 2003/0032361 A1, Feb. 13, 2003.

United States Patent Application Publication, Pub. No. US 2004/0018382, Jan. 29, 2004.

United States Patent Application Publication, Pub. No. US 2004/0217929 A1, Nov. 4, 2004.

International Search Report dated Jan. 17, 2003 for International Application No. PCT/US02/13547.

Article published in Bull. Korean Chem. Soc., vol. 20, No. 9, 1999 by Jeong Hee Han et al. entitled Correlation between Energy Transfer and Phase Separation in Emissive Polymer Blends.

Article published in Nano Letters, vol. 1, No. 8, 2001, pp. 429-433 by J. F. Suyver et al. entitled Synthesis and Photoluminescence on Nanocrystalline $ZnS:Mn^{2=}$.

Article by David Lieberman published online by EETimes at http://www.eetimes.com/story/OEG20000919S0014, Nov. 14, 2002.

Article published in Chem. Rev., 102, 2002, pp. 2357-2368, by Junji Kido et al. entitled Organo Lanthanide Metal Complexes for Electroluminescent Materials.

Article in the Handbook of Conducting Polymers by T.A. Skotheim et al. Eds., Marcel Dekker, Inc., New York, 1998, pp. 823-845, by R. H. Friend et al. entitled Electroluminescence in Conjugated Polymers.

Article published in the Journal of Molecular Electronics, vol. 4, 1998, pp. 37-46, by R. H. Friend entitled Optical Investigations of Conjugated Polymers.

Article published in the Japanese Journal of Applied Physics, vol. 21, No. 6, Jun. 1982, pp. 860-864, by Kenzo Kojima et al. entitled Electroluminescence in Polyethylene Terephthalate (PET) I. Impulse Voltage.

Article published in J. Chem. Soc.; Chem. Commun., 1983, pp. 954-955, by Denis G. H. Ballard et al. entitled A Biotech Route to Polyphenylene.

Article published in Polymer, vol. 30, Jun. 1989, (Conference issue) by John D. Stenger-Smith et al. entitled Spectroscopic and cyclic voltammetric studies of poly (*p*-phenylene vinylene) prepared from two different sulphonium salt precursor polymers.

Article published in J. Phys. D (Applied Physics), vol. 20, 1987, pp. 1389-1410, by D. D. C. Bradley entitled Precursor-route poly (p-phenylenevinylene): polymer characterization and control of electronic properties.

Article published in Synthetic Metals (28), 1989, pp. C687-C690, by H. Tomozawa et al. entitled Metal-Polymer Schottky Barriers on Processible Polymers.

Article in Luminescence of Solids, edited by D. R. Vij, Plenum Press, New York, 1998, pp. 221-269 by H. E. Gumlich et al. entitled Electroluminescence.

Article published online at http://www.geocities.com/Athens/Bridge/2702/CAP4I.htm entitled Display Devices.

Article in Advanced Materials, 14, No. 16, Aug. 16, 2002, pp. 1147-1150, by G. A. Hebbink et al. entitled Lanthanide (III)-Doped Nanoparticles That Emit in the Near-Infrared.

"Zinc Sulfide" online at http://ncsr-va.com/materials/zns.asp, Oct. 28, 2002.

Proceedings of the 2nd International Symposium on Advanced Luminescent Materials and Quantum Confinement, 201st Meeting of the Electrochemical Society, 185, 2002, by J. F. Suyver et al. entitled (Electro) Luminescence of Solutions, Powders and Layers of ZnSe:Cu Nanocrystals.

I-components website, Technology, at http://www.i-components.co.kr/korean/technology.htm, Nov. 14, 2002.

Orgacon Conductive Transparent Films, Application Sheet, entitled Patterning Orgacon Film by Means of UV Lithography, AGFA, revised May 2001.

http://www.kressworks.com/Research/Qu . . . /Electroluminescence¯Of¯Organic¯Polymer.ht, Jul, 3, 2002.

LIGHT-EMITTING PHOSPHOR PARTICLES AND ELECTROLUMINESCENT DEVICES EMPLOYING SAME

CROSS-REFERENCES TO RELATED PATENTS AND PATENT APPLICATIONS

This application is a divisional of and claims priority to U.S. patent application Ser. No. 10/207,576, filed Jul. 29, 2002 now U.S. Pat. No. 7,029,763, which is incorporated herein by reference in its entirety.

FIELD OF THE INVENTION

The present invention relates to light-emitting phosphor particles and light-emitting devices employing same, and more particularly, to light-emitting substance-coated phosphor particles and light emitting devices employing same.

BACKGROUND OF THE INVENTION

Fluorescence occurs when a material emits visible light after being excited by an excitation source applied from outside. A fluorescent lamp, a discharge tube, and a cathode ray tube utilize fluorescence. A material that emits fluorescence is called a phosphor.

Electroluminescence is a solid state phenomenon, which involves the emission of visible or invisible radiation as a result of the absorption of exciting energy. It is a general term which includes both fluorescence and phosphorescence. Invisible light further includes infrared and ultraviolet radiation.

An electroluminescent (EL) display device generally includes a layer of phosphor positioned between two electrodes, with at least one of the electrodes being light-transmissive. At least one dielectric also is positioned between the electrodes so the EL display device functions as a capacitor. When a voltage is applied across the electrodes, the phosphor material is activated and emits a light.

Phosphors may be employed in the manufacture of electroluminescent devices. Long-lasting phosphors are known in the art, and include sulfides and oxides. Many long-lasting phosphor products are those with a sulfide as their base crystal, such as ZnS:Cu. These are disadvantageous in that the after-glow lasts for a relatively short duration of time, for example, for about three hours at the longest.

Phosphorescence characteristics are influenced by composition, particle diameter, and environment, in particular, the phosphorescence brightness of phosphors. With respect to particle diameter, there is a tendency that the phosphorescence brightness decreases proportionally with a decrease in the particle diameter below 100 microns.

Light-emitting small molecules (LEMs) may also be employed in the manufacture of electroluminescent devices. Suitable light-emitting small molecules include quinolines, fluorescein, and the like.

Light-emitting polymers (LEPs) may further be employed in the manufacture of electroluminescent devices. Suitable light-emitting polymers include MEH-PPV (2-methoxy-5-2' ethylhexyloxy)-1,4-phenylenevinylene copolymer, MEH-BP-PPV (poly[2-Methoxy-5-(2'-ethylhexyloxy)-1,4-phenylenevinylene-co-4,4'-bisphenyleneviny]), and MEH-CN-PPV. These LEPs absorb radiation at about 400 to about 500 nm (blue light) and emit radiation at about 600 and 800 nm (yellow, orange, and red light).

The short lifetime of organic light-emitting polymers (LEPs) is presently a major impediment to their use in commercial environments. Organic LEPs are unstable when exposed to air and humidity. In addition to oxygen, other contaminants present in air, such as ozone and $NH_3$, also adversely affect the useful lifetime of LEPs.

Heretofore, lamps fabricated from LEPs have been entirely encapsulated, or have had exposed surfaces coated with protective layers to achieve stability. This large-scale encapsulation/coating process is costly, and requires the use of a relatively expensive transparent material.

In addition, the phosphors used in previous EL devices require relatively high voltage, typically in the range of about 60 to about 240 volts. What is needed is an electroluminescent device that requires minimal operating voltage and that exhibits long term stability without stringent inert atmosphere handling or encapsulation requirements.

Thus, it would be a contribution to the art to provide phosphor particles coated with a suitable light-emitting substance, wherein said substance may be molecular or polymeric in nature, or a combination of both, having enhanced stability for use in electroluminescent devices, as well as electroluminescent devices employing same. It would be a further contribution to the art to provide phosphor particles layered in an electroluminescent device with additional layers of other suitable light-emitting substances, wherein said substances may be molecular or polymeric in nature, or a combination of both.

SUMMARY OF THE INVENTION

The present invention provides light-emitting substance-coated phosphor particles.

The present invention also provides light-emitting polymer-coated phosphor particles.

The present invention additionally provides light-emitting molecule-coated phosphor particles.

The present invention further provides light-emitting polymer-coated phosphor particles.

Still further provided by the present invention are devices employing said light-emitting substance-coated phosphor particles.

Additionally provided are devices with layers of phosphor particles along with layers of other light-emitting substances, wherein said substances may be molecular or polymeric in nature, or a combination of both.

DETAILED DESCRIPTION OF THE INVENTION

Figure 1:
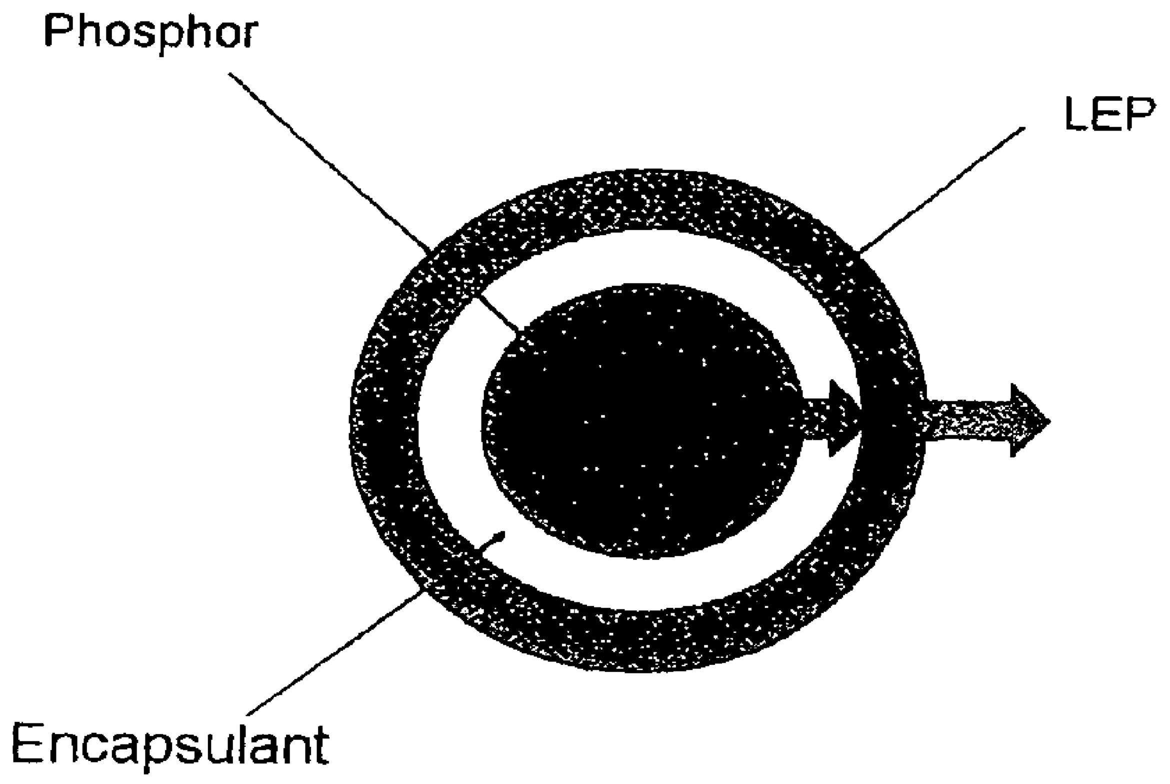
FIGS. 1, 1A, and 1B all illustrate a light-emitting polymer (LEP) coated phosphor particle and 1C illustrates a phosphor particle having a coating comprising a light-emitting polymer and a light-emitting small molecule.

The electroluminescent light-emitting substance (LES) can be chosen from a wide variety of light-emitting materials, including both small molecule or molecular (LEMs)

and polymeric light-emitting materials (LEPs), or a combination of both. The preparation and use of such materials is well known to those skilled in the art. LEM-coated or LEP-coated phosphor particles may be employed in place of traditional phosphors in electroluminescent devices. For discussion purposes, LEPs will be exemplified hereinbelow, but it is understood that LEMs or a combination of LEPs and LEMs may also be employed.

As used herein, the term polymeric material refers to materials having repeating structural units, such as polyphenylene, whereas the term molecular material refers to material that is a small molecule, or material having only one structural unit. These small molecules may be organic or inorganic.

Suitable light-emitting polymers include polypyridine, poly(p-phenylene vinylene) or poly[2-methoxy-5-(2'-ethylhexyloxy)-1,4-phenylenevinylene] may be used. Additional LEPs include poly[2-methoxy-5-(2-ethylhexyloxy)-1,4-phenylene-vinylene]; poly[(2-methoxy-5-(2-ethylhexyloxy)-1,4-phenylene-vinylene)-alt-co(4,4'-biphenylene-vinylene)]; poly[(9,9-dioctyl-2,7-divinylenefluorenylene)-alt-co-(9,10-anthracene)]; poly[(9,9-dioctyl-2,7-divinylenefluorenylene)-alt-co-(4,4'-biphenylene)]; poly[{9,9-dioctyl-2,7-divinylene-fluorenylene}-alt-co-{2-methoxy-5-(2-ethyl-hexyloxy)-1, 4-phenylene}]; poly[{9,9-dioctyl-2,7-bis(2-cyanovinylene-fluorenylene}alt-co-{2-methoxy-5-(2-ethyl hexyloxy)1, 4-phenylene}]; poly[2-methoxy-5-(2-ethylhexyloxy)-1,4-(1-cyanovinylenephenylene)]; poly[{9,9-dihexyl-2,7-bis(1-cyanovinylene)fluorenylene}-alt-co-{2,5-bis(N,N'-diphenylamino)-1, 4-phenylene}]; poly[{9-ethyl-3,6-bis(2-cyanovinylene)carbazolylene)[-alt-co-{2-methoxy-5-(2-ethylhexyloxy)-1,4-phenylene}]; poly[(9,9-di(2-ethylhexyl)-fluorenyl-2,7-diyl)-co-(N,N'-diphenyl)-N,N'-di-(p-butyl phenyl)-1,4-diaminobenzene]; poly[2-(6-cyano-6-methylheptyloxy)-1,4-phenylene); poly[{9,9-dioctylfluorenyl-2,7-diyl}-co-{1,4-(2,5-dimethoxy) benzene}]; poly[{9,9-dioctylfluorenyl-2,7-diyl}-co-{1,4-(2,5-dimethoxy)benzene}]; poly[(9,9-dioctylfluorenyl-2,7-diyl)-co-1,4-ethylenylbenzene)]; poly[(9,9-dioctylfluorenyl-2,7-diyl)-co-(1,4-diphenylene-vinylene-2-methoxy-5-{2-ethylhexyloxy}-benzene)]; poly[9,9-dihexylfluorenyl-2,7-divinylenefluorenylene)]; poly[9,9-dihexyl-2,7-(2-cyanodivinylene)-fluorenylene)]; poly[(9,9-dioctylfluorenyl-2,7-diyl)-co-(1,4-vinylenephenylene)]; poly[(9,9-dioctylfluorenyl-2,7-diyl)-co-(1,4-vinylenephenylene)]; poly(9,9-dioctylfluorenyl-2,7-diyl; poly(9,9-dihexylfluorenyl-2,7-diyl); poly[9,9-di(2-ethylhexyl)-fluorenyl-2,7-diyl]; poly[9,9-dioctylfluorenyl-2,7-diyl)-co-(N,N'-diphenyl)-N,N'-di(p-butyloxyphenyl)-1,4-diaminobenzene)]; poly[(9,9-dioctylfluorenyl-2,7-diyl)-alt-co-(N,N'-diphenyl)-N,N'-di(p-butyloxy-phenyl)1,4-diaminobenzene)]; poly[(9,9-dihexylfluorenyl-2,7-diyl)-co-(1,4-benzo-{2,1',3}-thiadiazole)]; poly[9,9-dihexylfluorenyl-2,7-diyl)-alt-co(9,10-anthracene)]; poly[(9,9-dioctylfluorenyl-2,7-diyl-alt-co-(N,N'-bis{4-butylphenyl}-benzidine-N,N'-{1,4-diphenylene})]; poly[(9,9-dihexylfluorenyl-2,7-diyl)-alt-co(2-methoxy-5-{2-ethylhexyloxy}-1,4-phenylene)]; poly[(9,9-dihexylfluorenyl-2,7-diyl)-co-(9,ethyl-3,6-carbazole)]; poly[9,9-dihexylfluorenyl-2,7-diyl)-alt-co-(9,ethyl-3,6-carbazole)]; poly[9,9-dihexylfluorenyl-2,7-diyl)-alt-co-(9,9'-spirobifluorene-2,7-diyl]; poly[9,9-dihexylfluorenyl-2,7-diyl)-co-(2,5-p-xylene)]; poly[(9,9-dihexylfluorenyl-2,7-diyl)-co-(3,5-pyridine)]; poly[(9,9-dihexylfluorenyl-2,7-diyl)-co(1,4-phenylene)]; poly[(9,9-dihexylfluorenyl-2,7-diyl)-alt-co-(9,9-di-{5-pentanyl}-fluorenyl-2',7'-diyl; poly[(9,9-dihexylfluorenyl-2,7-diyl)-co-(6,6'{2,2'-bipyridine})]; poly[(9,9-dihexylfluorenyl-2,7-diyl)-co-(6,6'-{2,2':6',2"-terpyridine})]; and poly[(9,9-dihexylfluorenyl-2,7-diyl)-co-(N,N' bis{p-butylphenyl}-1,4-diamino phenylene)}, all of which are commercially available from American Dye Source, Inc.

Suitable light-emitting small molecules include 8-hydroxyquinoline, fluorescein, rhodamine, xanthene or substituted xanthene, substituted coumarin, substituted hydroxycoumarin, substituted or unsubstituted tetra-cyanoquinolines, ethidium bromide, propidium iodide, benzoxanthene yellow, bisbenzimide((2'-[4-hydroxyphenyl]-5-[4-methyl-1-piperazinyl]-2, 5'-bi-1H-benzimidazol) and (2'-[4-ethoxyphenyl]-5-[4-methyl-1-piperazinyl]-2,5'-bi-1H-benzimidazol)), DAPI (4,6-diamidino-2-phenylindole), as well as light-emitting metal complexes, such as lithium tetra(2-methyl-8-hydroxyquinolinato)boron, bis(8-hydroxyquinolinato)zinc, tris(benzoylacetonato)mono(phenanthroline)europium(III), tris(2-phenylpyridine)iridium(III), and tris(8-hydroxyquinolinato)gallium(III).

In an alternative, other appropriate light emitting substances may include organic and inorganic complexes, such as tris(8-hydroxyquinolato) aluminum; tetra(2-methyl-8-hydroxyquinolato)boron; lithium salt; 4,4'-bis(9-ethyl-3-carbazovinylene)-1,1-biphenyl; 9,10-di[(9-ethyl-3-carbazoyl)-vinylenyl)]-anthracene; 4,4'-bis(diphenylvinylenyl)-biphenyl; 1,4-bis(9-ethyl-3-carbazovinylene)-2-methoxy-5-(2-ethylhexyloxy)benzene; tris(benzoylacetonato)mono(phenanthroline) europium (III); tris(dibenzoylmethane)mono(phenanthroline)europium (III); tris(dibenzoylmethane) mono(5-aminophenanthroline)europium (III); tris (dinapthoylmethane)mono(phenanthroline)europium (III); tris(biphenoylmethane)mono(phenanthroline)europium (III); tris(dibenzoylmethane)mono(4,7-diphenyl phenanthroline)europium (III); tris(dibenzoylmethane)mono(4,7-dimethyl-phenanthroline)europium (III); tris(dibenzoylmethane)mono(4,7-dihydroxy-phenanthroline)europium (III); tris(dibenzoylmethane)mono(4,7-dihydroxyloxy-phenanthroline)europium (III); lithium tetra(8-hydroxyquinolinato)boron; 4,4'-bis(9-ethyl-3-carbazovinylene)-1,1'-biphenyl; bis(8-hydroxyquinolinato)zinc; bis(2-methyl-8-hydroxyquinolinato)zinc; iridium (III) tris(2-phenylpyridine); tris(8-hydroxyquinoline)aluminum; and tris[1-phenyl-1-oyl)-pyrazolin-5-one]-terbium, many of which are commercially available from American Dye Source, Inc.

Figure 1A:
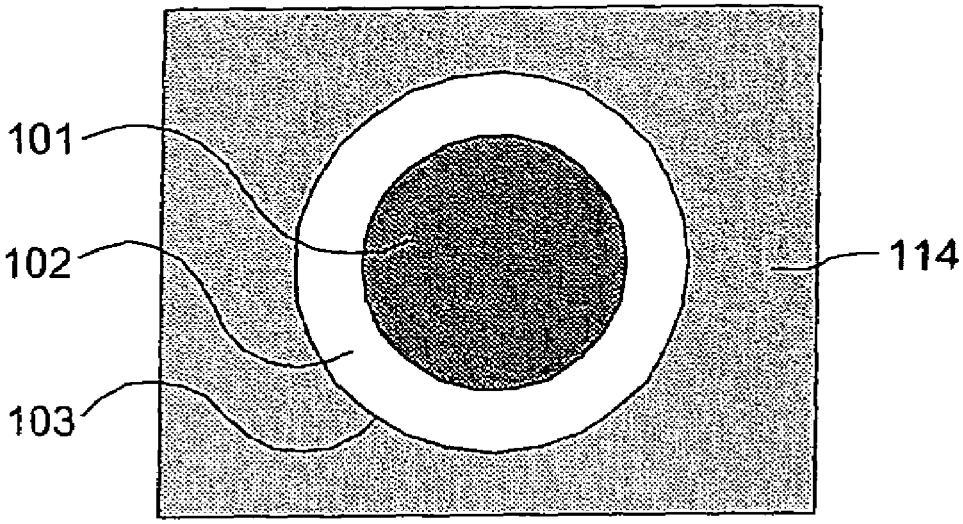
Figure 1B:
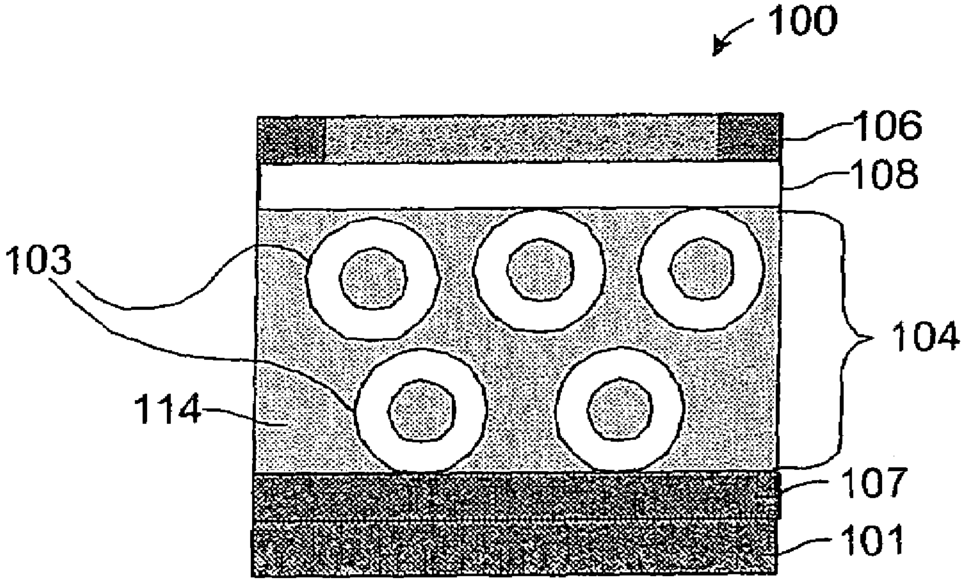
Figure 1C:
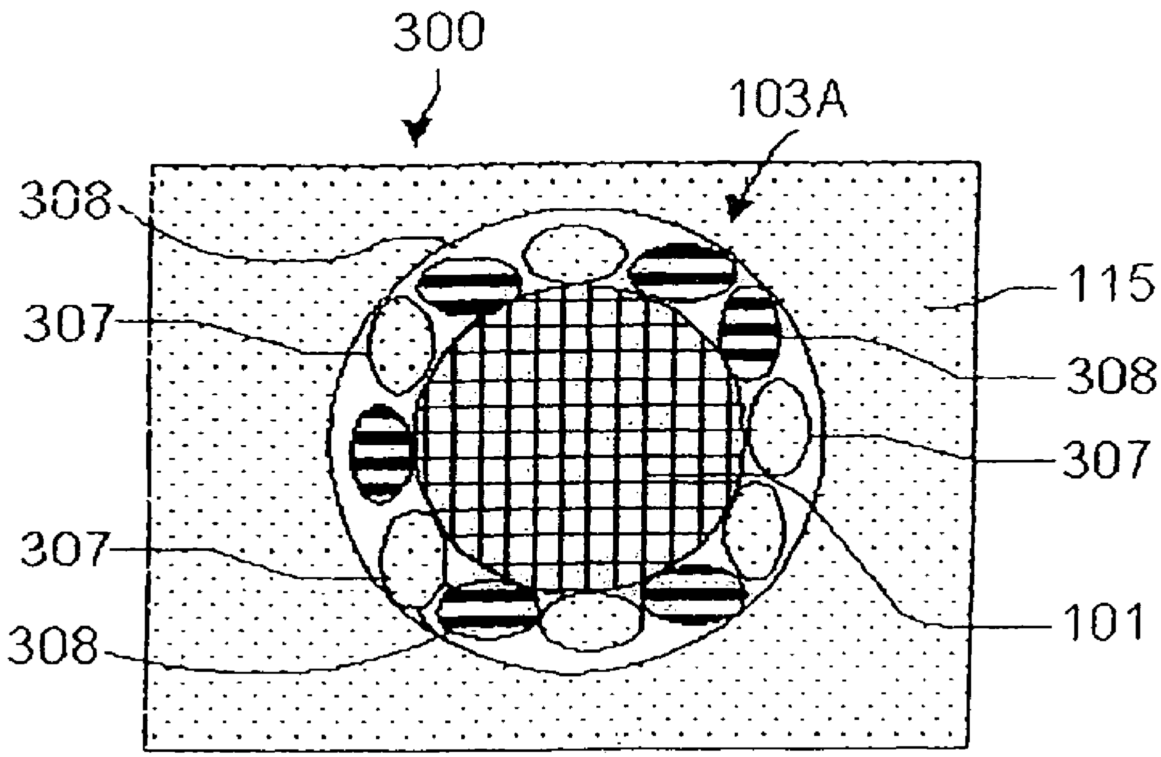

If a combination of both one or more light-emitting polymers (307) and light-emitting molecules (308) is to be employed in the coating (308) of the phosphor particle (101) to form the coated phosphor particle (103A) as shown in FIG. 1C, these polymers and molecules would be chosen in such a way as to provide for a functional overlap in the respective absorption and emission spectra, so as to provide the desired result. Further, these light-emitting substances are also initially chosen in a similar fashion in order to provide the desired result when combined with the chosen phosphor.

The light-emitting substance-phosphor particle may have a diameter of from about 0.05 microns to about 50 microns. Preferred are particles with a diameter of from about 10 microns to about 40 microns.

Unencapsulated phosphors may be coated with an LEP or LEM, optionally followed by encapsulation with a barrier coating.

The electroluminescent display devices of the instant invention employ organic light-emitting polymer (LEP)-phosphor particles or light-emitting molecule (LEM)-phosphor particles encapsulated with a conductive polymer or thin, insulative polymer to provide LEP and LEM stability.

The encapsulated particles may be formulated into an ink system that can be printed to form a light emitting device.

Alternatively, these components may be suitably layered without encapsulation of the particle to achieve the desired result.

U.S. patent application Ser. No. 60/287,321, filed Apr. 30, 2001, for an "Electroluminescent Device Fabricated With Encapsulated Light Emitting Polymer Materials", discloses a system for fabricating an electroluminescent display device from materials including light emitting polymers (LEPs), the disclosure of which is herein incorporated by reference.

The present electroluminescent device includes an illumination layer comprising LEP-phosphor particles which have been encapsulated with a conductive polymer or thin, transparent or semi-transparent insulative polymer (for example, polyvinylbutyral, Teflon®, polyethylene, and the like).

Figure 2:
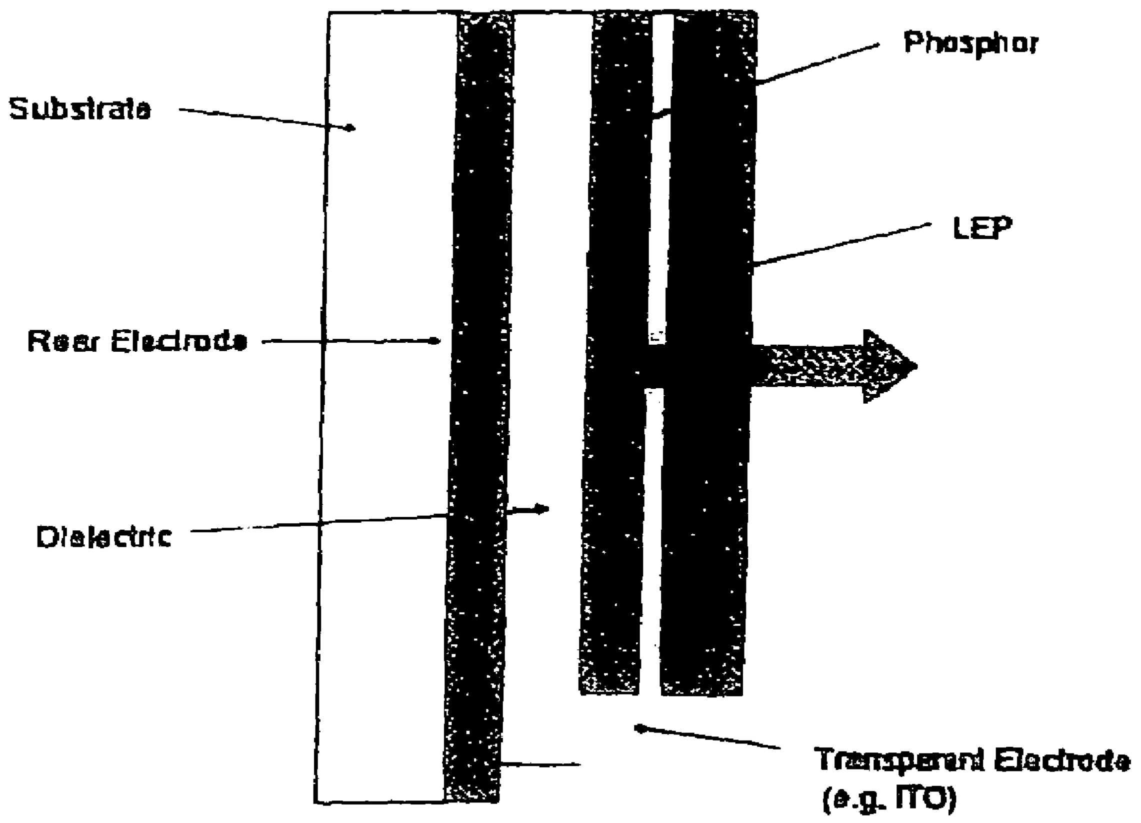
FIG. 2 illustrates a device employing an electroluminescent light-emitting polymer (LEP)-phosphor combination.
Figure 3:
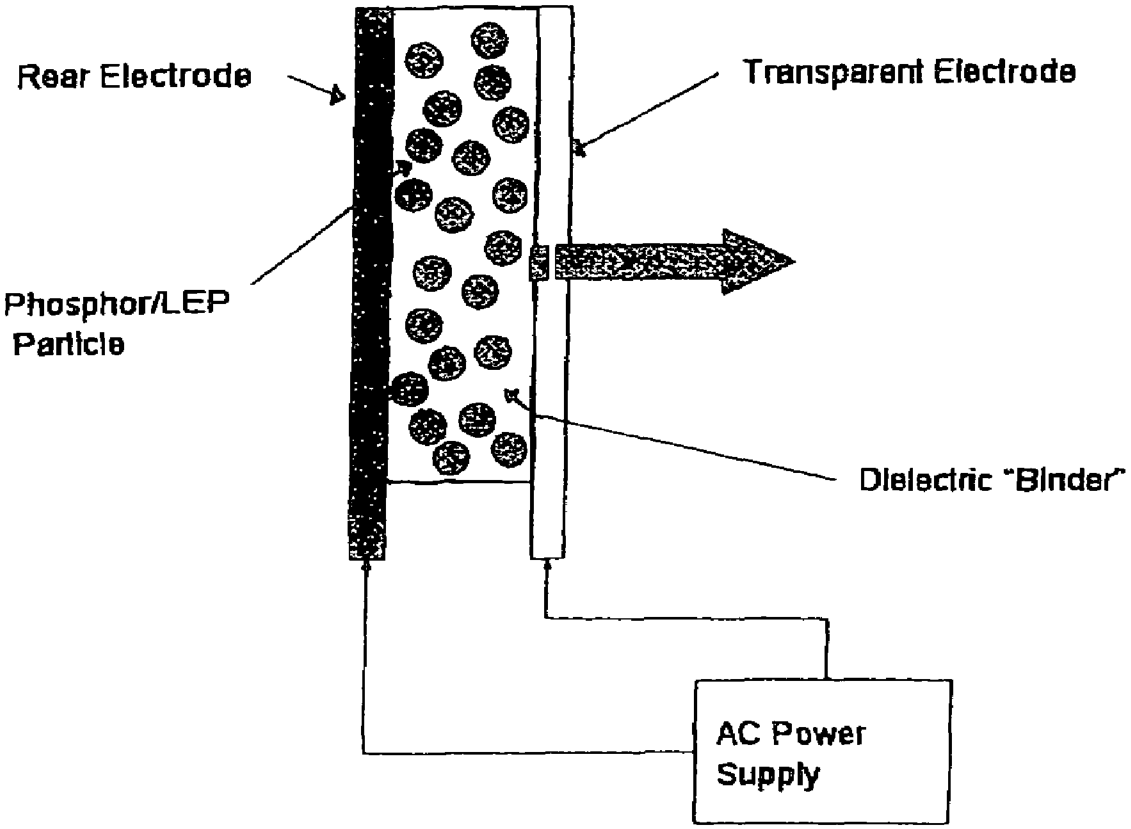
FIG. 3 illustrates a sandwich electrode configuration.

FIG. 1 provides a diagram of a light emitting polymer-phosphor particle. FIGS. 2 and 3 provide diagrams of a light emitting polymer-phosphor particle electroluminescent device.

LEP-phosphor or LEM-phosphor particles 101 are coated with a conductive polymer (for example, an inherently conductive polymer or ICP) 102 to form an encapsulated particle 103, which is suspended in a polymeric ink binder 114, to form illumination layer 104. Illumination layer 104 is sandwiched between a rear electrode layer 107 (for example, any conductive material including Ag, Mg, Al, Cu, and the like, or carbon or poly(3,4-ethylenedioxythiophene (PDOT) and the like) and a transparent electrode layer 108 (for example, polyaniline, polypyrrole, indium tin oxide, poly(3,4-ethylenedioxythiophene) and the like). Rear electrode layer 107 is situated on one surface of substrate 101. A front outlining electrode lead (FOEL) 106 is situated on the hole transporting electrode 108. At least one electrode should be transparent for the efficient transmission of the emitted light. Power connection leads (Ag or C) are attached to electron transporting layer 107 and to hole transporting layer 108.

In operation, an AC electrical potential having a frequency of between approximately 50 Hz and 1 Khz is applied across electron transporting layer 107 and hole transporting layer 108 to cause illumination of device 100.

The following Examples are provided in order to further illustrate the present invention.

EXAMPLES

Example 1

Production of a Light-emitting Polymer (LEP) Coated Phosphor Particle

Phosphor Particle Encapsulation Process:

In Step 205, phosphor particles 101 are prepared by precipitation, spray pyrolysis, spray chilling, and the like. Further reduction in particle size may be achieved by micronizing using an air mill or grinding them to an ultimate particle size of approximately 50 microns or less.

In Step 210, phosphor particles 101 are then coated with a light emitting polymer or light emitting small molecule 102, and optionally, followed by coating with a conductive polymer, or, alternatively, a thin, insulative polymer using a fluidized bed coater. LEPs such as poly(p-phenylene vinylene) or poly[2-methoxy-5-(2'-ethylhexyloxy)-1,4-phenylenevinylene] may be used.

In this process, the particles are fluidized in an air or nitrogen stream and LEP material 102 is spray coated onto the particles to form encapsulated particles 103 (LEP-phosphor particles).

In Step 215, a printing ink 104 may then be formulated by mixing the LEP encapsulated phosphor particles (103 or 103A) and binder polymers (114 or 115), for example, poly(methylmethacrylate) or poly(butylmethacrylate) in a suitable solvent. Other suitable binder polymers may be any suitable thermoplastic, including poly(vinylbutyral), poly (vinylalcohol), poly(vinylchloride), polycarbonate, polystyrene, poly(vinylidene chloride), poly(vinylidene fluoride), poly(acrylonitrile), poly(oxyethylene), cellulose esters, cellulose ethers, nylon 6,6, nylon 12, nylon 6,12, poly(ethylene oxide), poly(ethylene-co-vinylacetate), poly(vinylcarbazole), poly(caprolactone), polysulfone, poly(vinylpyrrolidone), poly(4-vinylphenol), poly(methyloctadecylsiloxane), and the like. Other binder systems that may be employed include systems employing thermosetting resins, for example, systems with urethane and epoxies, as well as UV-curable binder systems.

Example 2

Construction of a Device Employing an Electroluminescent Light-emitting Polymer (LEP)-Phosphor Combination Functional Stack Printing Process:

In Step 220, the rear electrode 107 is printed onto a suitable substrate in the desired pattern or patterns.

In Step 225, LEP-phosphor ink layer 104 is printed onto the rear electrode patterns 107.

In Step 230, a transparent electrode 108 is printed onto the LEP-phosphor layer 104.

In Step 235, the front outlining electrode lead (FOEL) 106 is printed onto the electrode 108. Appropriate connection leads (Ag or C) to rear electrode 107 and FOEL 106 are then printed.

The rear electrode and transparent electrode may be fabricated using conductive polymers to provide a totally polymeric system without metals or metallic compounds.

FIG. 3 shows an LEP-phosphor ink matrix formed with LEP-phosphor particles with a dielectric binder material. One method of forming this mixture is to contact a LEP-phosphor ink matrix with a suitable binder.

LEP-phosphor ink matrix may be used as layer 104 in device 100.

Figure 4:
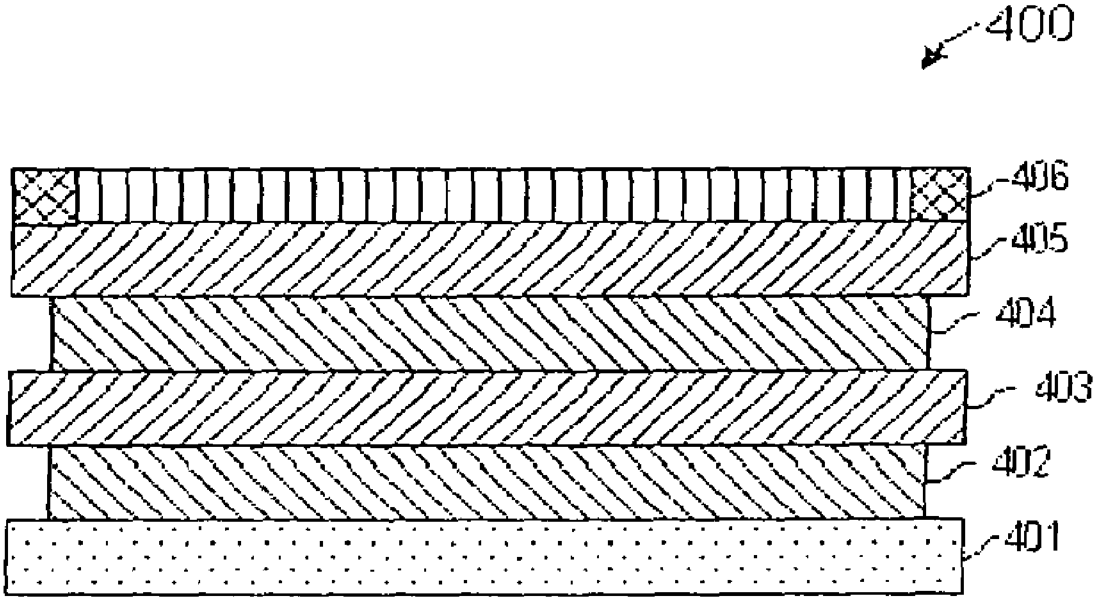
FIG. 4 illustrates an alternative embodiment of an electroluminescent display device.

FIG. 4 is a schematic illustration of an alternative embodiment of an electroluminescent (EL) multi-segment display device 400 comprising a substrate 401, a rear electrode layer 402, a dielectric layer 403, an illumination layer 404, an electrically conductive layer 405, and a front outlining electrode lead ("front electrode") 406. Substrate 401 may comprise either metal or an electrically non-conducting material. If, for example, an aluminum substrate is used, then it is first coated with an insulative material.

Rear electrode 402 is formed of an electrically conductive material, for example, silver or carbon particles. Dielectric layer 403 is formed of high dielectric constant material, such as barium titanate. Illumination layer 404 is formed of LEP-phosphor particles, as described above. Front electrode 406 may be formed of indium tin oxide (ITO), silver particles, or other electrically conductive material.

Figure 5:
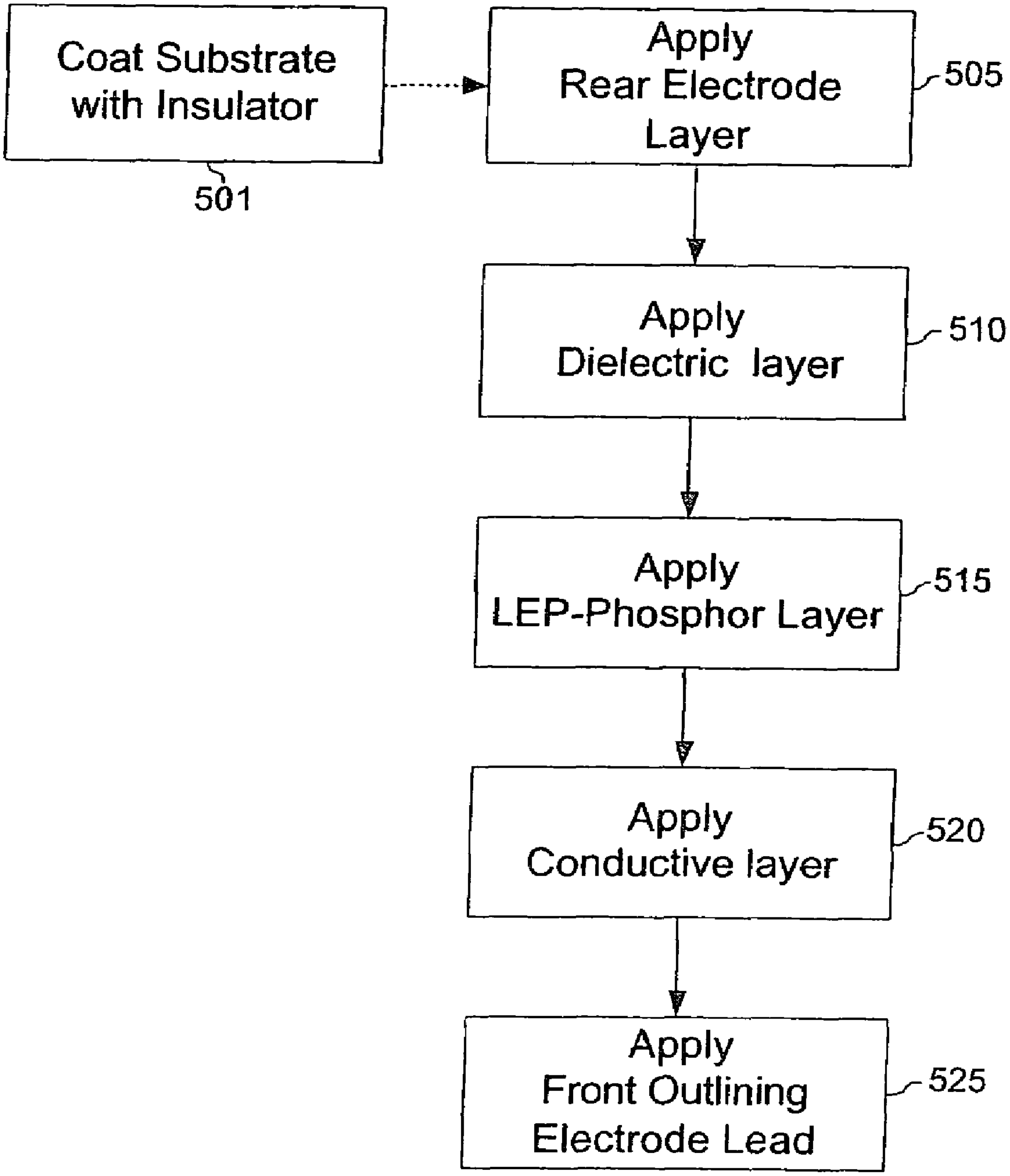
FIG. 5 illustrates a flowchart of an exemplary method for fabricating an electroluminescent device.
Figure 6:
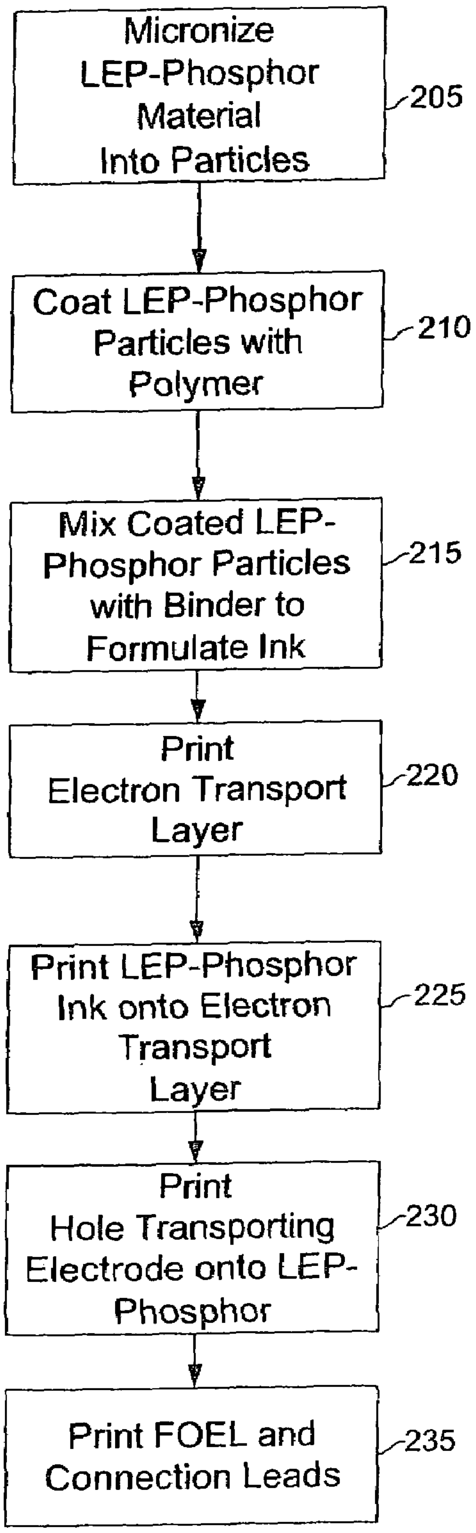
FIG. 6 illustrates an additional flowchart of an exemplary method for fabricating an electroluminescent device.

FIG. 5 is a flow chart showing an exemplary sequence of steps for fabricating the electroluminescent display device shown in FIG. 3. Fabrication of the present device 100 is best understood by viewing FIGS. 4 and 5 in conjunction with one another. If substrate 401 is a metal or other conductor, such as aluminum, then at step 501, an insulative coating is first applied over the substrate using a compound such as Nazdar's Plastic Plus (Nazdar Mid-America, St. Louis, Mo.). If substrate 401 is formed from a non-conductor, such as a polyester film, polycarbonate, or other plastic material, no coating is required.

At step 505, rear electrode 402 is applied over a front surface of substrate 401. In an exemplary embodiment, rear electrode 402 is formed of conductive particles, for example, silver or carbon, dispersed in a polymeric or other binder to form a screen printable ink. In one embodiment, rear electrode 402 may comprise a silver particle ink such as DuPont 7145. Alternatively, rear electrode 402 may comprise a conductive polymer such as polyaniline, polypyrrole, and poly(3,4-ethylenedioxythiophene). In an exemplary embodiment, a carbon rear electrode 402 may have a thickness of between approximately 0.2 millimeters and 0.6 millimeters. However, any suitable electrode thickness may be employed. It is to be noted that rear electrode layer 402, as well as each of the layers 403-406 that are successively applied in fabricating device 100, may be applied by any appropriate method, including an ink jet process, a stencil, flat coating, brushing, rolling, spraying, etc.

Rear electrode layer 402 may cover the entire substrate 401, but this layer 402 typically covers only the illumination area (the area covered by LEP layer 404, described below).

At Step 510, optional dielectric layer 403 is applied over rear electrode layer 402. In an exemplary embodiment, dielectric layer 48 comprises a high dielectric constant material, such as barium titanate dispersed in a polymeric binder to form a screen printable ink. In one embodiment, the dielectric may be an ink, such as DuPont 7153. Dielectric layer 403 may cover substrate 401 either entirely, or may alternatively cover only the illumination area. Alternatively, dielectric layer 403 may include a high dielectric constant material such as alumina oxide dispersed in a polymeric binder. The alumina oxide layer is applied over rear electrode 164 and cured by exposure to UV light. In an exemplary embodiment, dielectric layer 403 may have a thickness of between approximately 20 microns and 31 microns.

In accordance with one embodiment, dielectric layer 403 has substantially the same shape as the illumination area, but extends approximately 1/16" to 1/8" beyond the illumination area. Alternatively, dielectric layer 402 may cover substantially all of substrate 401.

At Step 515, illumination layer 404 is applied over dielectric layer 403. Illumination layer 404 is formulated in accordance with the process described above with respect to FIGS. 1A, 1B, and 2. The size of the illumination area covered by the illumination layer 404 may range from approximately 1 sq. mm to 1000 sq. cm. In an exemplary embodiment of the present system, illumination layer 404/104 comprises light-emitting polymer phosphor particles, and has a thickness of between approximately 20 microns and 31 microns.

At Step 520, conductive layer 405 is printed over LEP-phosphor particle layer 404, extending about 1/16" to 1/8" beyond LEP-phosphor particle area 404. The distance beyond the Illumination layer to which conductive layer 405 extends is a function of the size of the device. Accordingly, the extension of conductive layer 405 beyond Illumination area 404 may advantageously be between approximately 2 percent and 10 percent of the width of Illumination layer 404. In an exemplary embodiment, conductive layer 405 comprises indium tin oxide (ITO) particles in the form of a screen printable ink such as DuPont 7160. In an alternative embodiment, conductive layer is non-metallic and is translucent or transparent, and comprises a conductive polymer, such as polyaniline, polypyrrole, or poly(3,4-ethylenedioxythiophene). In an exemplary embodiment, an ITO conductive layer 405 may have a thickness of between approximately 5 microns and 13 microns.

At Step 525, a front electrode, or more specifically, a front outlining electrode layer 406, comprising a conductive material such as silver or carbon, is applied onto the outer perimeter of conductive layer 405 to transport electrical current thereto. Front electrode 406 is typically a 1/16" to 1/8" wide strip, approximately 2 percent to 20 percent of the width of conductive layer 405, depending on the current drawn by device 100 and the length of the device from the controller or power source. For example, front electrode 406 may be approximately 1/8" wide for a 50" wire run from the controller.

Front electrode leads 525 may be screen printed onto the conductive layer 520, or may be fabricated as interconnect tabs extending beyond the substrate to facilitate connection to a power source or controller. In one embodiment, front outlining electrode layer contacts substantially the entire outer perimeter of the conductive layer and does not overlap rear electrode. In an alternative embodiment, front electrode 406 contacts only about 25% of outer perimeter of conductive layer 405. Front electrode may be fabricated to contact any amount of the outer perimeter of conductive layer 405 from about 25% to about 100%. Front outlining electrode 406 may, for example, comprise silver particles that form a screen-printable ink, such as DuPont 7145. In an alternative embodiment, front outlining electrode 406 is non-metallic and is translucent or transparent, and comprises a conductive polymer, such as polyaniline, polypyrrole, or poly(3,4-ethylenedioxythiophene). Fabricating front and rear electrodes 406/102 with polymers such as the aforementioned compounds would make device 100 more flexible, as well as more durable and corrosion resistant. In an exemplary embodiment, a silver front outlining electrode layer 406 may have a thickness of between approximately 20 microns and 28 microns.

What is claimed is:

1. A phosphor particle having a coating that comprises a light emitting small molecule that is selected from 1,4-bis(9-ethyl-3-carbazovinylene)-2-methoxy-5-(2-ethylhexyloxy)benzene, tris(dibenzoylmethane)mono(phenanthroline) europium (III), tris(dinapthoylmethane)mono(phenanthroline) europium (III), tris(dibenzoylmethane) mono(4,7-diphenyl phenanthroline)europium (III), tetra(8-hydroxyquinolinato) boron, or mixtures thereof, and wherein the coating encapsulates the phosphor particle.

2. The phosphor particle of claim 1 wherein said phosphor particle has a diameter of from about 0.3 microns to about 50 microns.

3. The phosphor particle of claim 1 wherein said phosphor particle has a diameter of from about 10 microns to about 40 microns.

4. The phosphor particle of claim 1 distributed in a dielectric polymer to form an ink.

5. An electroluminescent display device comprising a phosphor particle according to claim 1.

6. An electroluminescent display device comprising:

a phosphor particle having a coating comprising a light emitting small molecule wherein the coating encapsulates the phosphor particle;

an ink comprising said coated phosphor particles and at least one binder polymer;

a conducting rear electrode on a substrate in a pattern;

said ink deposited onto said rear electrode;

an optional transparent hole transporting electrode;

a front outlining electrode; and connection leads to the rear electrode and the front outlining electrode.

7. The device of claim 6, wherein the light emitting small molecule is selected from 8-hydroxyquinoline, fluorescein, rhodamine, xanthene, substituted xanthene, substituted coumarin, substituted hydroxycoumarin, substituted tetra-cyanoquinolines, unsubstituted tetra-cyanoquinolines, ethidium bromide, propidium iodide, benzoxanthene yellow, bisbenzimide ((2'-[4-hydroxyphenyl]-5-[4-methyl-1-piperazinyl]-2,5'-bi-1H-benzimidazol) and (2'-[4-ethoxyphenyl]-5-[4-methyl-1-piperazinyl]-2,5'-bi-1H-benzimidazol)), DAPI (4,6-diamidino-2-phenylindole), lithium tetra (2-methyl-8-hydroxyquinolinato)boron, tris(benzoylacetonato) mono(phenanthroline)europium(III), tris(2-phenylpyridine) iridium(III), tris(8-hydroxyquinolinato)gallium(III), tetra(2-methyl-8-hydroxyquinolato) boron, lithium salt, 4,4'-bis(9-ethyl-3-carbazovinylene)-1,1'-biphenyl, 9,10-di[(9-ethyl-3-carbazoyl)-vinylenyl)]-anthracene, 4,4'-bis (diphenylvinylenyl)-biphenyl, 1,4-bis(9-ethyl-3-carbazovinylene)-2-methoxy-5-(2-ethylhexyloxy)benzene, tris(benzoylacetonato)mono(phenanthroline) europium (III), tris(dibenzoylmethane)mono(phenanthroline) europium (III), tris(dibenzoylmethane)mono(5-aminophenanthroline)europium(III), tris(dinapthoylmethane) mono(phenanthroline) europium (III), tris(biphenoylmethane)mono(phenanthroline) europium (III), tris (dibenzoylmethane)mono(4,7-diphenyl phenanthroline) europium (III), tris(dibenzoylmethane)mono(4,7-dimethylphenanthroline)europium (III), tris(dibenzoylmethane) mono(4,7-dihydroxy-phenanthroline)europium (III), tris (dibenzoylmethane)mono(4,7-dihydroxyloxy-phenanthroline)europium (III), lithium tetra(8-hydroxyquinolinato) boron, 4,4'-bis(9-ethyl-3-carbazovinylene)-1,1'-biphenyl, bis(8-hydroxyquinolinato) zinc, bis(2-methyl-8-hydroxyquinolinato)zinc, indium (III) tris(2-phenylpyridine), tris[1-phenyl-3-methyl-4-(2,2-dimethylpropan-1-oyl)-pyrazolin-5-one]-terbium, or mixtures thereof.

8. The device of claim 7, wherein said coated phosphor particles are encapsulated with a barrier coating.

9. The device of claim 7, which further comprises a dielectric layer.

10. An electroluminescent display device comprising:

an ink formulated by mixing phosphor particles with at least one binder polymer;

a conducting rear electrode deposited onto a substrate in a pattern;

said ink deposited onto said rear electrode;

a layer containing a light emitting small molecule;

an optional transparent hole transporting electrode;

a front outlining electrode deposited onto said hole transporting electrode; and connection leads to the rear electrode and the front outlining electrode.

11. The device of claim 10, wherein said phosphor particles are encapsulated with a barrier coating.

12. The device of claim 10, which further comprises a dielectric layer.

13. The device of claim 10, wherein said light-emitting small molecule is selected from 8-hydroxyquinoline, fluorescein, rhodamine, xanthene, substituted xanthene, substituted coumarin, substituted hydroxycoumarin, substituted tetra-cyanoquinolines, unsubstituted tetra-cyanoquinolines, ethidium bromide, propidium iodide, benzoxanthene yellow, bisbenzimide ((2'-[4-hydroxyphenyl]-5-[4-methyl-1-piperazinyl]-2,5'-bi-1H-benzimidazol) and (2'-[4-ethoxyphenyl]-5-[4-methyl-1-piperazinyl]-2,5'-bi-1H-benzimidazol)), DAPI (4,6-diamidino-2-phenylindole), lithium tetra (2-methyl-8-hydroxyquinolinato)boron, tris(benzoylacetonato) mono(phenanthroline)europium(III), tris(2-phenylpyridine) iridium(III), tris(8-hydroxyquinolinato)gallium(III), tetra(2-methyl-8-hydroxyquinolato) boron, lithium salt, 4,4'-bis(9-ethyl-3-carbazovinylene)-1,1'-biphenyl, 9,10-di[(9-ethyl-3-carbazoyl)-vinylenyl)]-anthracene, 4,4'-bis (diphenylvinylenyl)-biphenyl, 1,4-bis(9-ethyl-3-carbazovinylene)-2-methoxy-5-(2-ethylhexyloxy)benzene, tris(benzoylacetonato)mono(phenanthroline) europium (III), tris(dibenzoylmethane)mono(phenanthroline) europium (III), tris(dibenzoylmethane)mono(5-aminophenanthroline)europium(III), tris(dinapthoylmethane) mono(phenanthroline) europium (III), tris(biphenoylmethane)mono(phenanthroline) europium (III), tris (dibenzoylmethane)mono(4,7-diphenyl phenanthroline) europium (III), tris(dibenzoylmethane)mono(4,7-dimethylphenanthroline)europium (III), tris(dibenzoylmethane) mono(4,7-dihydroxy-phenanthroline)europium (III), tris (dibenzoylmethane)mono(4,7-dihydroxyloxy-phenanthroline)europium (III), lithium tetra(8-hydroxyquinolinato) boron, 4,4'-bis(9-ethyl-3-carbazovinylene)-1,1'-biphenyl, bis(8-hydroxyquinolinato) zinc, bis(2-methyl-8-hydroxyquinolinato)zinc, iridium (III) tris(2-phenylpyridine), tris[1-phenyl-3-methyl-4-(2,2-dimethylpropan-1-oyl)-pyrazolin-5-one]-terbium, or mixtures thereof.

14. A method of preparing a phosphor particle having a coating comprising a light emitting small molecule, the method comprising forming a coating on a phosphor particle wherein the coating comprises a light emitting small molecule that is selected from 1,4-bis(9-ethyl-3-carbazovinylene)-2-methoxy-5-(2-ethylhexyloxy)benzene, tris(dibenzoylmethane)mono(phenanthroline) europium (III), tris (dinapthoylmethane)mono(phenanthroline) europium (III), tris(dibenzoylmethane)mono(4,7-diphenyl phenanthroline) europium (III), tetra(8-hydroxyquinolinato) boron, or mixtures thereof, and wherein the coating encapsulates the phosphor particle.

15. A method for fabricating an electroluminescent display device comprising:

formulating an ink by mixing phosphor particles with at least one binder polymer, wherein each phosphor particle has a coating comprising a light emitting small molecule wherein the coating encapsulates the phosphor particle;

depositing a conducting rear electrode onto a substrate in a pattern;

depositing said ink onto said rear electrode to form a layer;

optionally depositing a transparent hole transporting electrode onto said layer;

depositing a front outlining electrode; and depositing connection leads to the rear electrode and the front outlining electrode.

16. The method according to claim 15, wherein the light emitting small molecule is selected from 8-hydroxyquinoline, fluorescein, rhodamine, xanthene, substituted xanthene, substituted coumarin, substituted hydroxycoumarin, substituted tetra-cyanoquinolines, unsubstituted tetra-cyanoquinolines, ethidium bromide, propidium iodide, benzoxanthene yellow, bisbenzimide ((2'-[4-hydroxyphenyl]-5-[4-methyl-1piperazinyl]-2,5'-bi-1H-benzimidazol) and (2'-[4-ethoxyphenyl]-5-[4-methyl-1-piperazinyl]-2,5-bi-1H-benzimidazol)), DAPI (4,6-diamidino-2-phenylindole), lithium tetra (2-methyl-8-hydroxyquinolinato)boron, tris(benzoylacetonato)mono(phenanthroline)europium(III), tris(2-phenylpyridine)iridium(III), tris(8-hydroxyquinolinato)gallium(III), tetra(2-methyl-8-hydroxyquinolato) boron, lithium salt, 4,4'-bis(9-ethyl-3-carbazovinylene)-1,1'-biphenyl, 9,10-di[(9-ethyl-3-carbazoyl)-vinylenyl)]-anthracene, 4,4'-bis(diphenylvinylenyl)-biphenyl, 1,4-bis(9-ethyl-3-carbazovinylene)-2-methoxy-5-(2-ethylhexyloxy)benzene, tris (benzoylacetonato)mono(phenanthroline) europium (III), tris(dibenzoylmethane)mono(phenanthmiine) europium (III), tris(dibenzoylmethane)mono(5-aminophenanthroline) europium(III), tris(dinapthoylmethane)mono(phenanthroline) europium (III), tris(biphenoylmethane)mono(phenanthroline) europium (III), tris(dibenzoylmethane)mono(4,7-diphenyl phenanthroline)europium (III), tris (dibenzoylmethane)mono(4,7-dimethyl-phenanthroline) europium (III), tris(dibenzoylmethane)mono(4,7-dihydroxy-phenanthroline)europium (III), tris (dibenzoylmethane)mono(4,7-dihydroxyloxy-phenanthroline)europium (III), lithium tetra(8-hydroxyquinolinato) boron, 4,4'-bis(9-ethyl-3-carbazovinylene)-1,1'-biphenyl, bis(8-hydroxyquinolinato) zinc, bis(2-methyl-8-hydroxyquinolinato)zinc, iridium (III) tris(2-phenylpyridine), tris[1-phenyl-3-methyl-4-(2,2-dimethylpropan-1-oyl)-pyrazolin-5-one]-terbium, or mixtures thereof.

17. The method of claim 15, wherein said coated phosphor particles are encapsulated with a barrier coating.

18. The method of claim 15, which further comprises depositing a dielectric layer.

* * * * *

UNITED STATES PATENT AND TRADEMARK OFFICE

CERTIFICATE OF CORRECTION

PATENT NO. : 7,303,827 B2 
APPLICATION NO. : 11/344934
DATED : December 4, 2007
INVENTOR(S) : Patrick J. Kinlen and Matthew Murasko It is certified that error appears in the above-identified patent and that said Letters Patent is hereby corrected as shown below:

On Title Page item 56
Page 2, Right Column:
Line 3 of the fourth reference, replace the term "$ZnS{:}Mn^{2=}$" with the term
-- $ZnS{:}Mn^{2+}$ --.
Line 2 of the 21st reference, replace the term "¯Of¯Organic¯" with the terms
-- _Of_Organic_ --.

Column 1:
Line 61, replace the term "bisphenylenevinyl" with the term -- bisphenylenevinylene --.

Column 4:
Line 43, replace the terms "tris[1-phenyl-l-oyl-)-pyrazolin-5-one]-terbium, with the terms
-- tris[1-phenyl-3-methyl-4(2,2-dimethylpropan-1-oyl)-pyrazolin-5-one]-terbium, --.

Signed and Sealed this

Twenty Second Day of April, 2008

JON W. DUDAS
*Director of the United States Patent and Trademark Office*